United States Patent [19]
Kinoshita

[11] Patent Number: 6,025,219
[45] Date of Patent: Feb. 15, 2000

[54] METHOD OF MANUFACTURING A SEMICONDUCTOR DEVICE HAVING MOS TRANSISTOR AND BIPOLAR TRANSISTOR IN MIXTURE ON THE SAME SUBSTRATE

[75] Inventor: Yasushi Kinoshita, Tokyo, Japan

[73] Assignee: NEC Corporation, Tokyo, Japan

[21] Appl. No.: 09/049,929

[22] Filed: Mar. 30, 1998

[30] Foreign Application Priority Data

Mar. 31, 1997 [JP] Japan .................................. 9-080006

[51] Int. Cl.[7] .................. H01L 21/8238; H01L 21/8249
[52] U.S. Cl. ......................... 438/202; 438/234; 438/207
[58] Field of Search .................................. 438/202, 234, 438/207, 331, 217, 309

[56] References Cited

U.S. PATENT DOCUMENTS

| | | | |
|---|---|---|---|
| 4,734,382 | 3/1988 | Krishna | 437/31 |
| 5,943,564 | 8/1999 | Chen et al. | 438/202 |

FOREIGN PATENT DOCUMENTS 6-291262  10/1994  Japan .
7-273285  10/1995  Japan .

Primary Examiner—John F. Niebling
Assistant Examiner—Neal Berezny
Attorney, Agent, or Firm—Foley & Lardner

[57] ABSTRACT

There are formed simultaneously a first conductive layer selectively on a region of a semiconductor substrate in which an N-channel MOS transistor is to be formed and on a region of the semiconductor in which a p-channel MOS transistor is to be formed, a second conductive layer on a region of the semiconductor substrate in which a capacitive element is to be formed, and a third conductive layer on a region of the semiconductor substrate in which the resistive element is to be formed. Next, there are formed simultaneously a first insulating film on the lateral side of the first conductive layer, a second insulating film selectively on the second conductive layer, and a third insulating film selectively on the third conductive layer. Then the fourth insulating film is formed on the whole surface. Thereafter there are formed simultaneously a fifth conductive layer on a region of the semiconductor substrate in which a bipolar transistor is to be formed, and a sixth conductive layer on the fourth insulating film on the second conductive layer.

16 Claims, 8 Drawing Sheets

METHOD OF MANUFACTURING A SEMICONDUCTOR DEVICE HAVING MOS TRANSISTOR AND BIPOLAR TRANSISTOR IN MIXTURE ON THE SAME SUBSTRATE

BACKGROUND OF THE INVENTION

1. Field of the Invention

The present invention relates to a method of manufacturing a semiconductor device having a surface channel type MOS transistor, a bipolar transistor, a resistive element and a capacitive element in mixture on the same substrate, and more specifically to a method of manufacturing a semiconductor device which is designed to realize high efficiency by reduction of manufacturing steps.

2. Description of the Related Art

With the progress of the technique for manufacturing semiconductor integrated circuit (IC) devices, there has been used a semiconductor IC device having a digital circuit and an analog circuit on the same substrate. As such IC device, a BiCMOS device which contains a CMOS transistor with which a logic circuit can be easily formed and a bipolar transistor which is capable of processing the faint analog signal at high speed and linearly are suitable. Especially, in case the IC device is applied to the GHz band communication technique and the like, a greater speed operation is required on the bipolar transistor, so that there is used in general a transistor formed by self-alignment of an emitter region and a base contact region.

It is rarely the case for such IC device to be constituted by only a CMOS transistor and a bipolar transistor, and there is assembled, for example, a circuit called ECL (Emitter Coupled Logic) circuit along with the resistive element in the digital circuit. The ECL circuit is a current changeover type logic circuit, in which the IC device can be operated at extremely high speed without causing saturated motion of the bipolar transistor.

On the other hand, in an analog circuit, a resistive element is indispensable for the constitution of a bias circuit for determining the operating point. Further, for the constitution of a filter circuit which is indispensable for the analog circuit, there is required not only the resistive element but also a capacitive element.

As described above, in order to manufacture the above semiconductor IC device, it is necessary to form not only the transistors but also the passive elements such as resistive element and capacitive element. Accordingly, it is important not to induce the increased number of steps as far as possible, in forming these elements in the same substrate.

In view of the above, in the formation of the passive elements, there is extensively practiced a method of using a polycrystalline line silicon layer which forms a base electrode of a self-alignment bipolar transistor, gate electrode of a MOS transistor or the like together with the electrodes of the passive elements.

Especially, there is disclosed a method of adding a capacitive element to a semiconductor device such as BiCMOS LSI and the like without largely increasing the number of steps (Japanese Unexamined Patent Publication (Kokai) No. Hei 6-291262). FIGS. 1A to 1G are sectional views showing a method of manufacturing a semiconductor device in order of process disclosed in Japanese Unexamined Patent Publication (Kokai) No. Hei 6-291262. In the manufacturing method as disclosed in the publication, first, as shown in FIG. 1A, by photolithographic technique and ion implantation of arsenic to a P-type silicon substrate 101, an N$^+$-type buried layer 102 is formed selectively in a bipolar transistor portion, in which a bipolar transistor is to be formed. Next, in order to make electrical insulation and separation of the bipolar transistor portion, a P$^+$-type buried layer 103 is formed around the N$^+$-type buried layer 102. Subsequently, the substrate 101 is heated to a level higher than 1000° C., and an N-type single crystalline silicon layer 105 is grown on the silicon substrate 101 in a film thickness of about 2 μm. In this case, the N$^+$-type buried layer 102 and the P$^+$-type buried layer 103 are expanded to the N-type single crystalline silicon layer 105. Next, in the region positioned above the P$^+$-type buried layer 103, a P-type channel stopper layer 104 is formed in the N-type single crystalline silicon layer 105. Further, for separation of elements, an element separation oxide film 106 is formed on the surface of the N-type single crystalline silicon layer 105 by the selective oxidation (LOCOS) method. Here, a film thickness of the element separation oxide film 106 is about 500 nm, and a long time thermal oxidation at 1000° C. is required for forming the film 106. The P$^+$-type buried layer 103 and the P-type channel stopper layer 104 are expanded by thermal diffusion of boron impurities during this thermal oxidation step. By the phenomenon, the bipolar transistor portion is electrically separated from other portions, in which other elements are to be formed, by the P-type silicon substrate 101, P$^+$-type buried layer 103 and P-type channel stopper layer 104.

The formation of the P$^+$-type buried layer 103 may be carried out simultaneously with the formation of the P-type channel stopper layer 104.

Next, as shown in FIG. 1B, N-type impurities such as phosphorus are selectively ion-implanted to the N-type single crystalline silicon layer 105 with a mask. And, the implanted impurities are electrically activated by providing a thermal processing in nitrogen atmosphere at 900 to 1000° C. for 10 to 30 minutes. By the step, a collector leading region 107 of an NPN-type transistor, which is a bipolar transistor is formed. Next, a gate oxidation film 108 having a film thickness of 10 to 20 nm is formed. Subsequently, a polycrystalline silicon layer 109 having a film thickness of about 100 to 200 nm is formed by CVD method on the whole surface. Next, by patterning by dry etching with a mask, a base-emitter forming region 110 is formed.

Further, as shown in FIG. 1C, regions to become a gate electrode of a P-channel MOS transistor or the like are formed by patterning the polycrystalline silicon layer 109. Then, a polycrystalline silicon layer 111 having a film thickness of 100 to 200 nm is formed on the whole surface by CVD method. As a result, the thickness of the polycrystalline silicon layer becomes 300 to 400 nm in the maximum. Thereafter, with a mask, N-type impurities are ion implanted in high concentration into a region in which the gate electrode of the P-type MOS transistor is to be formed, and P-type impurities are ion implanted in high concentration into a region in which a base electrode of the bipolar transistor portion is to be formed. Subsequently, by dry etching technique, there are processed the polycrystalline silicon layers 109 and 111 in a region other than the region in which the gate electrode is to be formed and the region in which the base electrode is to be formed.

Further, a P$^-$LDD diffusion layer 112 is formed by ion-implanting P-type impurities in low concentration only in the P-channel MOS transistor portion by with a mask. Thereafter, an oxide film having a film thickness of 200 to 400 nm is formed on the whole surface by CVD method, and the whole surface of the substrate is subjected to an isotropic etching by dry etching technique to form a side wall 113. Next, by ion-implanting P-type impurities in high concentration into the MOS transistor portion with a mask, a P+ source-drain diffusion layer 114 is formed.

In FIG. 1C, the P-channel MOS transistor portion is formed in the N-type single crystalline silicon layer 105, but it is general to form an N-type well on the P-channel MOS transistor portion by adding a sheet of mask.

In FIG. 1C, the P-channel MOS transistor portion is illustrated, but an N-channel MOS transistor portion is not illustrated. To form an N-channel MOS transistor, in the same manner as in the P-channel MOS transistor, two masks are necessary for forming a LDD region and a source-drain region. Further, a mask is necessary for forming a P-type well in the N-channel MOS transistor portion.

Next, as shown in FIG. 1D, an oxide film 115 having a film thickness of 300 to 400 nm is deposited on the whole surface of the substrate by CVD method.

Subsequently, as shown in FIG. 1E, the oxide film 115 in the region 116 in which a capacitive element is to be formed is selectively opened by lithographic technique and etching technique. Next, a nitride film having a film thickness of 30 to 60 nm is formed by CVD method and dry etching is processed to allow a capacitive nitride film 117 to remain in the region in which a MIS capacitor is to be formed.

Next, as shown in FIG. 1F, the oxide film 115 in an emitter contact region 118, in which an emitter contact of the bipolar transistor is to be formed, and polycrystalline silicon layers 109 and 111 are removed by dry etching technique. Then, an intrinsic base region is formed in the emitter contact region 118 by ion implantation. Then, an oxide film having a film thickness of 400 to 600 nm is formed by CVD method, and etching-back is performed by isotropic etching of dry etching technique. As a result, an oxide film side wall 119 for separating the emitter and the base electrode region is formed on the side wall of the emitter contact region 118, by which the base electrode region and the emitter electrode region are electrically insulated.

Next, a polycrystalline silicon layer is grown on the substrate in a thickness of 100 to 200 nm, and a polycrystalline silicon layer 120 for forming the emitter is formed by dry etching technique. The polycrystalline silicon layer 120 functions also as an upper electrode of the capacitive element. And, the ion implantation into the polycrystalline silicon layer 120 and heat treatment are conducted. By the step, the source-drain diffusion layer of the P-channel MOS transistor portion is activated, and the P-type impurities are diffused in high concentrations from the base drawing electrode to form a graft base 123. Also, the emitter is formed by the impurity diffusion of arsenic or phosphorus from the polycrystalline silicon layer 120.

Next, as shown in FIG. 1G, an inter-layer insulation film 121 having a film thickness of 300 to 400 nm is formed by CVD method, after which contact holes 122 are opened with the wiring technique to form the respective electrodes. Hereinafter, the semiconductor device is completed by the conventional method.

On the other hand, recently, with respect to a MOS transistor of short gate length, in order to reduce the resistance of the gate electrode and the resistance of the source-drain diffusion layer, there is practiced a method of silicifying the gate electrode surface and the source-drain diffusion layer with, for example, a refractory metal such as Ti. In this case, it is necessary to have the surfaces of the diffusion layer and the polycrystalline silicon layer to be silicified exposed in advance.

However, recently, high efficiency system has been demanded in the semiconductor device manufacturing process, and the requirements cannot be met by the conventional method as described above.

Furthermore, according to the conventional manufacturing method as described above, because the oxide film is grown over the whole surface of the substrate and the MOS transistor portion is fully covered for forming the capacitive element, there is required a mask for) selectively removing the oxide film in order to expose the surfaces of the silicifying diffusion layer and polycrystalline silicon layer. Furthermore, in case of using the gate electrode of the MOS transistor or the base electrode or the emitter electrode of the bipolar transistor as the resistive element, it becomes necessary to form a protective film to prevent the whole surface of the resistive element from being silicified, thereby increase of processes is invited.

In the conventional semiconductor IC device, in both the P-channel MOS transistor and the N-channel MOS transistor, the N-type gate electrode is applied. Therefore, although the N-channel MOS transistor is a surface channel type one, the P-channel MOS transistor essentially becomes a buried channel type one. Since the buried channel type MOS transistor shows low current-off characteristics, it has a defect of showing larger leak current than the surface channel type one. Also, it has large short channel effect, and involves difficulty in threshold level control. Accordingly, when the gate length is shortened, it becomes essential to use a surface channel type MOS transistor for the P-channel MOS transistor as well as the N-channel MOS transistor.

However, when it is desired to apply the surface channel type P-channel MOS transistor to the conventional manufacturing method as described above, in view of the problem of thermal career, it is difficult to form it without deteriorating the respective characteristics of the P-channel MOS transistor and the bipolar transistor.

That is because, while conventionally there is normally used an ion implantation for forming the gate, the source and the drain of the P-channel MOS transistor and there are independently practiced the heat treatment necessary for formation of the bipolar transistor and the heat treatment necessary for formation of the gate, the source and the drain of P-channel MOS, oozing out of the boron implanted into the gate, the source or the drain to the channel region tends to occur. Especially, for the formation of the graft base of the bipolar transistor, there is required at least the furnace annealing at 850° C. for 10 to 30 minutes. But, the heat treatment is excessive with respect to the P-channel type MOS transistor under the condition of the boron in the gate, the source and the drain being activated. Namely, when the heat treatment is provided, formation of the P-channel MOS transistor having the fine gate length becomes difficult.

Further, there is proposed a method of manufacturing a semiconductor device in which the voltage dependency of the capacitive element can be reduced without increasing the number of manufacturing steps (Japanese Unexamined Patent Publication (Kokai) No. Hei 7-273285). In the conventional semiconductor device manufacturing method as described in the above publication, for example, arsenic ion is implanted simultaneously into the upper electrode of the capacitive element and the source-drain diffusion layer of the MOS transistor.

According to the conventional method as described above, as the impurity concentration difference between the upper electrode and the lower electrode of the capacitive element can be restricted, the voltage dependency of the capacitive element can be made small. In addition, as the ion implantation into the upper electrode is made simultaneously with the ion implantation into the source-drain diffusion layer, the increase of cost can be kept to a small degree.

However, even by the above conventional method, the problem that the number of steps increases due to the silicifying the gate electrode surface and the source-drain diffusion layer is not settled. Furthermore, the problem that occurs at the time of making the P-channel MOS transistor of a surface channel type is not settled.

In Japanese Unexamined Patent Publication (Kokai) No. Hei 7-273285, there is proposed a semiconductor device which is schemed to lower the voltage dependency of a capacitive element. However, in the publication a semiconductor device having a capacitive element and a MOS transistor in mixture on the same substrate is described, but it is utterly silent of the relations with the BiCMOS.

SUMMARY OF THE INVENTION

An object of the present invention is to provide a method of manufacturing a semiconductor device having a MOS transistor and a bipolar transistor in mixture on the same substrate, which can be processed in small steps, wherein preferably an N-channel type and a P-channel type MOS transistors can be made into the surface channel type ones, and a gate electrode and a source-drain diffusion layer can be easily silicified.

The method of manufacturing a semiconductor device having a MOS transistor and a bipolar transistor in mixture on the same substrate comprises the steps of forming simultaneously a first conductive layer selectively on a region of a semiconductor substrate in which an N-channel MOS transistor is to be formed and on a region in which a P-channel MOS transistor is to be formed, a second conductive layer on a region of the semiconductor substrate in which a capacitive element is to be formed, and a third conductive layer on a region of the semiconductor substrate in which a resistive element is to be formed; forming simultaneously a first insulating film on the lateral side of the first conductive layer, a second insulating film selectively on the second conductive layer, and a third insulating film selectively on the third conductive layer; forming a fourth insulating film on whole surface; and forming simultaneously a fifth conductive layer on a region of the semiconductor substrate in which a bipolar transistor is to be formed, and a sixth conductive layer on the fourth insulating film on the second conductive layer.

According to the present invention, due to the formation of the necessary conductive layers or insulating films on the plural regions by using the same material, drastic promotion of efficiency of the manufacturing process can be accomplished.

Additionally, as it is possible to expose only the region which is expected to be silicified in silicifying the gate electrode and the source-drain diffusive layer and the like, there is no necessity to use a mask for exclusive use for the process, or a protective film. Accordingly, it becomes possible to reduce the number of process steps further to lower the cost.

Furthermore, as the P-type impurities are implanted into the region in which the P-channel MOS transistor is to be formed and on the surface of the third conductive layer not covered with the third insulation film after forming the graft base of the bipolar transistor beneath the fifth conductive layer, even when the P-channel MOS transistor is made a surface channel type, the leak current and the short channel effect can be extremely suppressed. Therefore, the present invention can sufficiently meet the shortening of the gate length.

DETAILED DESCRIPTION OF THE PREFERRED EMBODIMENTS

The embodiments of the invention will be concretely described below with reference to the accompanied drawings. FIGS. 2A to 2I are sectional views showing a manufacturing method of the semiconductor device according to the first embodiment of the present invention in order of process steps. In the embodiment, first, a P-type silicon substrate 1 is divided into a bipolar transistor portion, in which a bipolar transistor is to be formed, a P-channel MOS transistor portion, in which a P-channel MOS transistor is to be formed, an N-channel MOS transistor portion, in which an N-channel MOS transistor is to be formed, a capacitive element portion, in which a capacitive element is to be formed, and a resistive element portion, in which a resistive element is to be formed.

Figure 2A:
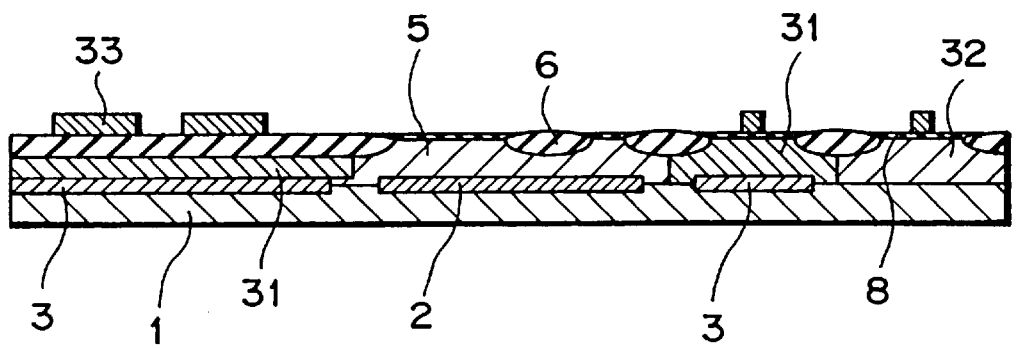
FIGS. 2A to 2I are sectional views showing a manufacturing method of the semiconductor device according to the first embodiment of the present invention in order of process steps.

Next, as shown in FIG. 2A, an $N^+$-type buried layer 2 is formed by ion implantation in the bipolar transistor portion of the P-type silicon substrate 1 with a mask. At this time, an $N^+$-type buried layer 2 may be formed additionally on the P-channel MOS transistor portion. Next, a $P^+$-type buried layer 3 is formed on the N-channel MOS transistor portion and on the peripheral part of the bipolar transistor portion. The bipolar transistor is to be separated by insulation from other elements by the $P^+$-type buried layer 3. Next, while the substrate 1 is heated to a level higher than 1000° C., an N-type single crystalline silicon layer 5 is grown epitaxially on the P-type silicon substrate 1. The $N^+$-type buried layer 2 and the $P^+$-type buried layer 3 are expanded to the N-type single crystalline silicon layer 5 by heating during the step.

Subsequently, by ion implantation, a P-type well 31 is formed on the N-channel MOS transistor portion and on the peripheral part of the bipolar transistor portion, and an N-type well 32 is formed on the P-channel MOS transistor portion. An element separation oxide film 6 is formed by a LOCOS method, which is selective oxidation method, in a thickness of 300 to 400 nm. Next, a gate oxide film 8 and a polycrystalline silicon layer not doped with impurities are grown sequentially on the whole surface of the substrate. A film thickness of the gate oxide film 8 is 5 to 15 nm, and a thickness of the polycrystalline silicon layer is 150 to 200 nm. Next, by selectively removing the polycrystalline silicon layer by dry etching. Therefore, the polycrystalline silicon layer 33 is allowed to remain only in gate electrode forming regions, a lower electrode forming region and a resistor forming region. It should be noted that the gate electrode forming regions are regions in which gate electrodes of the both MOS transistors are to be formed, that the lower electrode forming region is a region in which a lower electrode of the capacitive element is to be formed, and that the resistor forming region is a region in which the resistor of the resistive element is to be formed.

The P-type well 31 and the N-type well 32 may be formed by the high energy ion implantation technique after the selective oxidation.

Figure 2B:
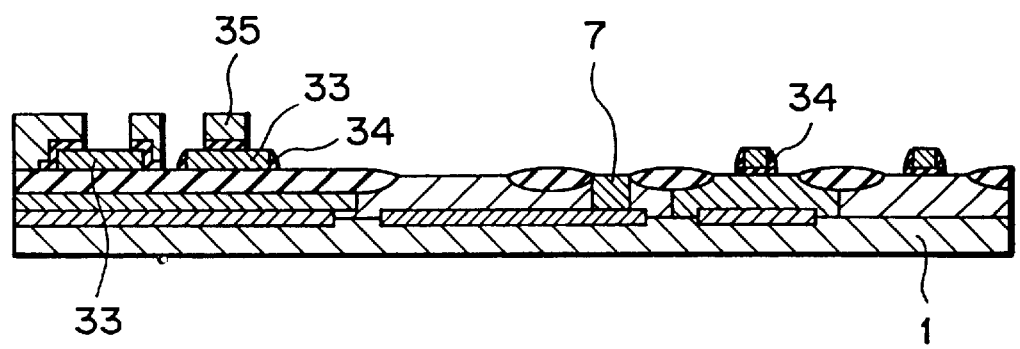

Next, as shown in FIG. 2B, N-type impurities such as phosphorus are selectively ion-implanted to the N-type single crystalline silicon layer 5 with a mask. By the step, there is formed a collector leading region 7 of an NPN-type transistor which is the bipolar transistor. During the step, there may be practiced simultaneously ion implantation into the lower electrode forming region in order to reduce the number of process steps. Further, in order that the predetermined resistance is obtained, impurities such as boron, for example, are ion-implanted into the polycrystalline silicon layer 33 in the resistive element portion. Then, after forming an oxide film having a thickness of 50 to 100 nm on the whole surface, the capacitive element portion and the resistive element portion are selectively masked with a resist 35 to etch back the oxide film.

Figure 1A:
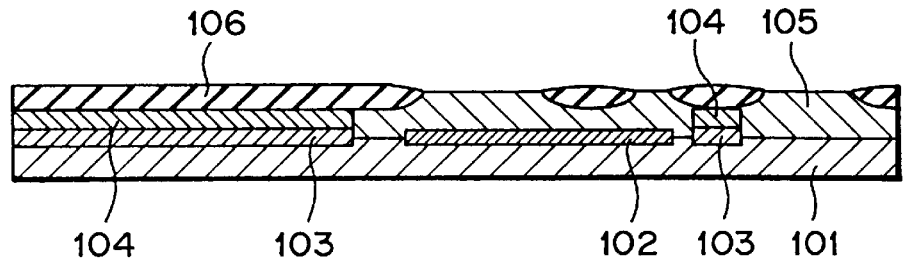
FIGS. 1A to 1G are sectional views showing a manufacturing method of the semiconductor device described in Japanese Unexamined Patent Publication (Kokai) No. Hei 6-291262, in order of process steps.
Figure 1B:
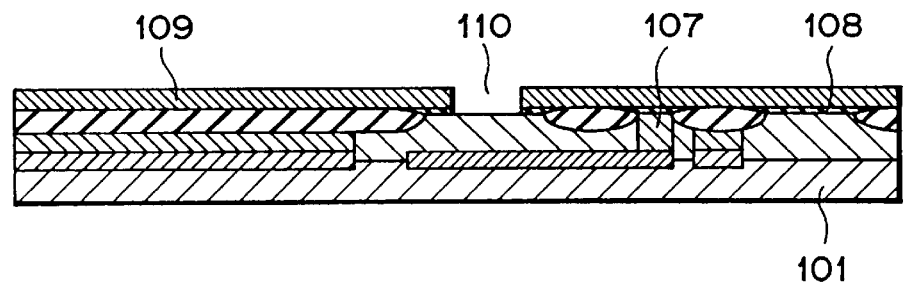
Figure 1C:
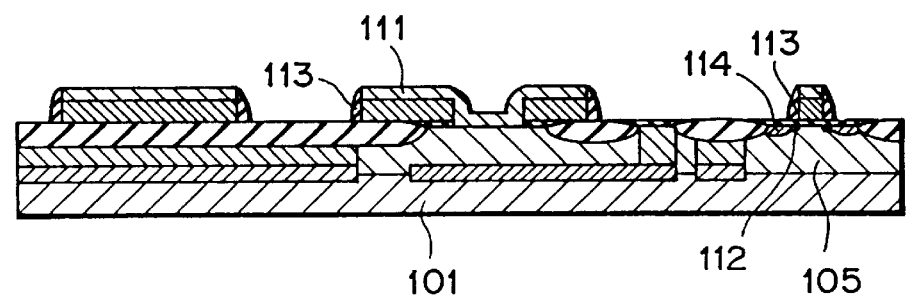
Figure 1D:
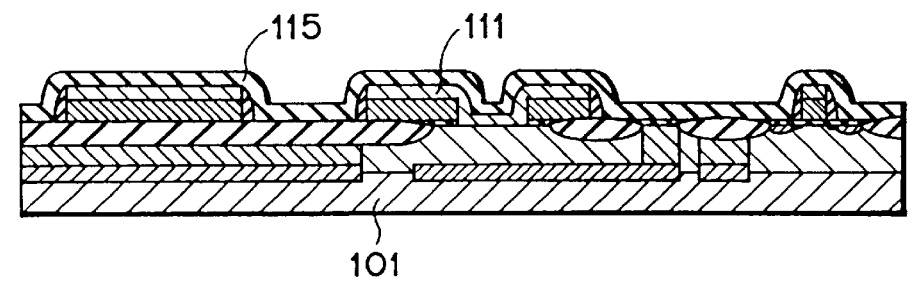
Figure 1E:
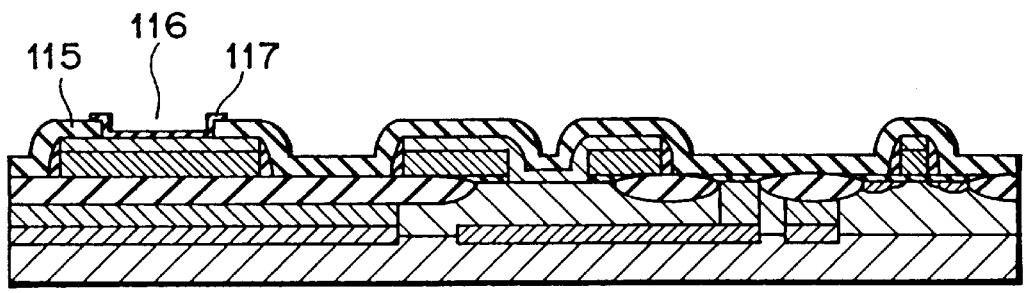
Figure 1F:
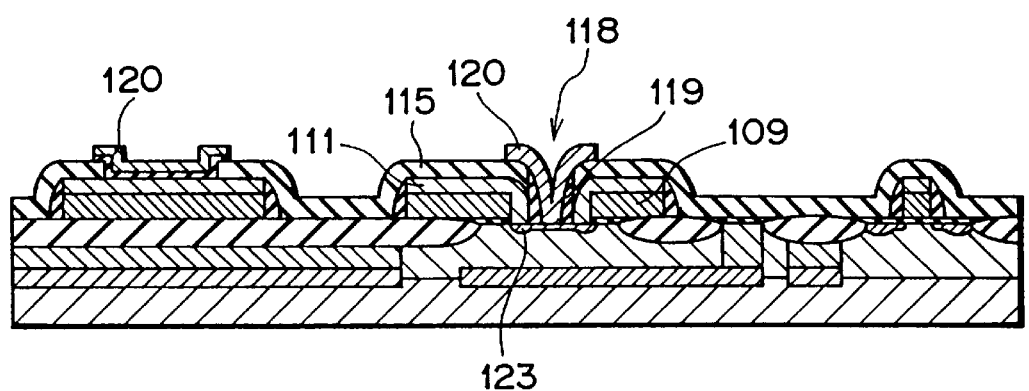
Figure 1G:
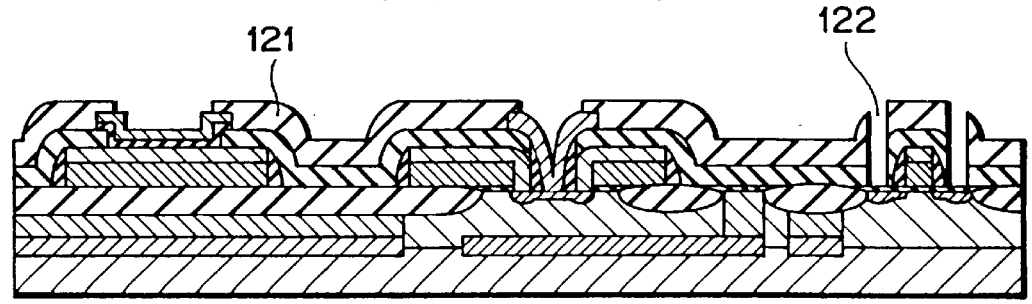

By the process, a first side wall oxide film 34 is formed on the lateral side of the polycrystalline silicon layer 33 of the both MOS transistor portions. Also, the surface of the polycrystalline silicon layer 33 to be the lower electrode is partially exposed in the capacitive element portion. In this respect, this process corresponds to the step for opening the capacitive contact as shown in FIG. 1E in the conventional manufacturing method. On the other hand, the first side wall oxide film 34 is formed on the lateral side of the polycrystalline silicon layer 33, and the oxide film remains partially on the surface of the polycrystalline silicon layer 33 in the resistive element portion. This is in order to make such that, in the subsequent silicifying process, the whole surface of the resistive element is not silicified to define the resistor length.

Figure 2C:
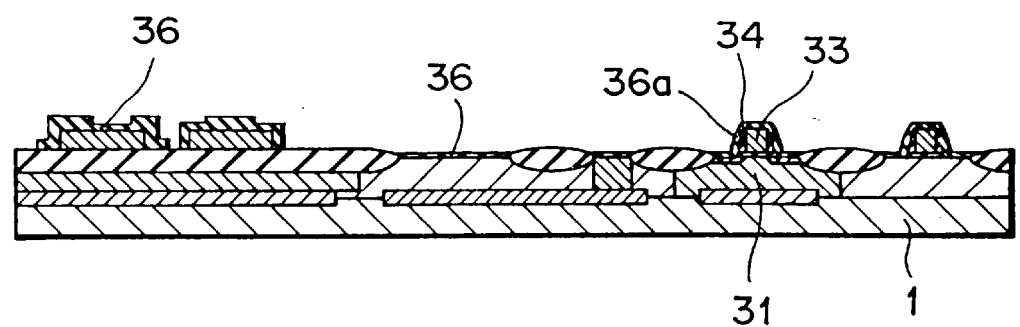

Next, as shown in FIG. 2C, after removing the resist 35, an oxide film 36 having a thickness of 10 to 30 nm is formed on the whole surface. Thereby a second side wall oxide film 36a is formed on the lateral side of the first side wall oxide film 34 in the both MOS transistor portions and the resistive element portion. It should be noted that he oxide film 36 formed in this step functions also as a capacitive insulation film of the capacitive element. Thereafter, arsenic is ion-implanted by self-alignment manner into a source-drain forming region in which a source-drain diffusion layer of the N-channel MOS transistor is to be formed, and a gate electrode forming region in which a gate electrode of the N-channel MOS transistor is to be formed. The implantation energy at this time is set in the range of 30 to 80 keV according to the film thickness, so that the arsenic is passed through the second side wall oxide film 36 and is implanted to the predetermined depth of the P-type well 31. In the range of implantation energy, it does not occur for the arsenic to penetrate through the polycrystalline silicon layer 33, which is to become the gate electrode.

Then, in nitrogen atmosphere, at a temperature of 850 to 900° C., heat treatment is carried out for 5 to 15 minutes. By the heat treatment, the impurities in the source-drain forming region of the N-channel MOS transistor are electrically activated, and the activation of the collector leading region, the resistive element portion, and the lower electrode forming region also can be made simultaneously.

The first side wall oxide film and the second side wall oxide film are stacked in this order on the lateral side of the polycrystalline silicon layer 33 of the resistive element portion in the condition as shown in FIG. 2C. However, they are hereinafter illustrated as the one layer for convenience.

Figure 2D:
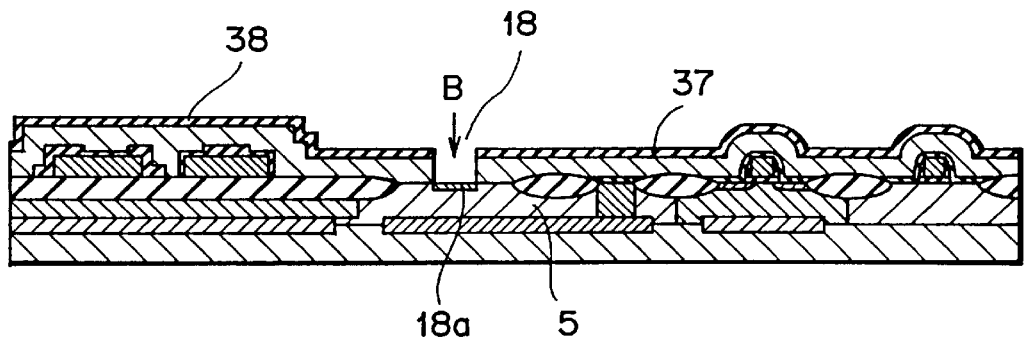

Next, as shown in FIG. 2D, the oxide film is removed only in a region in which a base and an emitter of the bipolar transistor are to be formed. After the step, a polycrystalline silicon layer 37 and an insulating film 38 composed of a nitride film or the like are sequentially stacked on the whole surface of the substrate. The P-type impurities such as boron are ion-implanted into the polycrystalline silicon layer 37. Thereafter, an emitter contact region 18 is formed by etching the insulating film 38 and the polycrystalline silicon layer 37 on a region in which an emitter contact of the bipolar transistor is to be formed with dry etching technique. Then, an intrinsic base layer 18a is formed in the emitter contact region 18 by ion-implanting P-type impurities such as boron into the N-type single crystalline silicon layer 5.

Figure 2E:
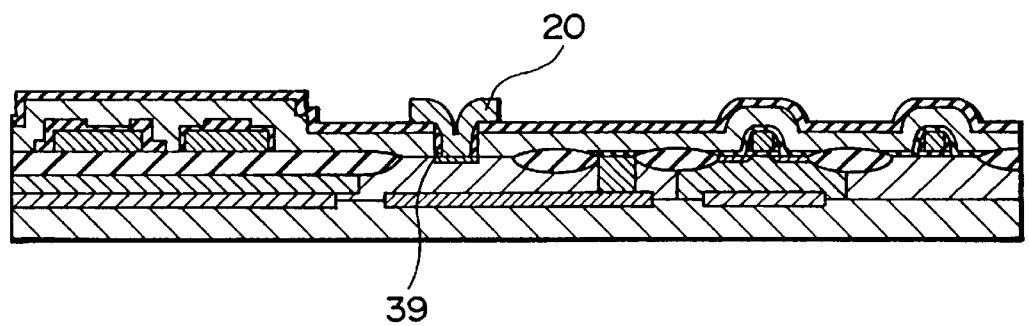

Next, as shown in FIG. 2E, a side wall oxide film 39 is formed in the emitter contact region 18 using etch-back technique, after which a polycrystalline silicon layer is stacked on the whole surface of the substrate. To this polycrystalline silicon layer, N-type impurities such as arsenic or phosphorus have been added by ion implantation yet, or the N-type impurities are doped at the time of stacking. Subsequently, the polycrystalline silicon layer is patterned to form an emitter electrode 20 from the polycrystalline silicon layer by dry etching.

Figure 2F:
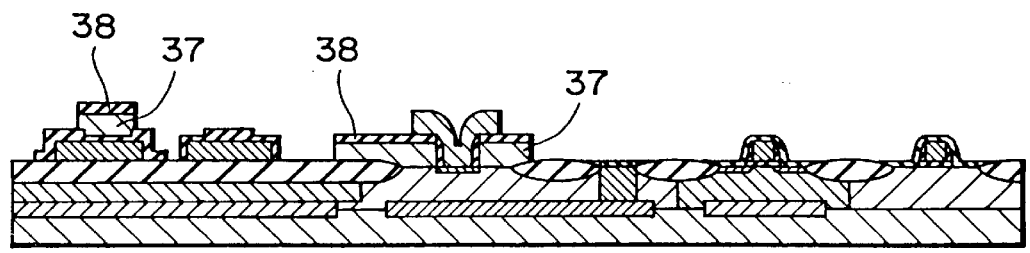

Next, as shown in FIG. 2F, the insulation film 38 and the polycrystalline silicon layer 37 are patterned by dry etching to remain in a region in which a base electrode of the bipolar transistor is to be formed, and a region in which an upper electrode of the capacitive element is to be formed.

Figure 2G:
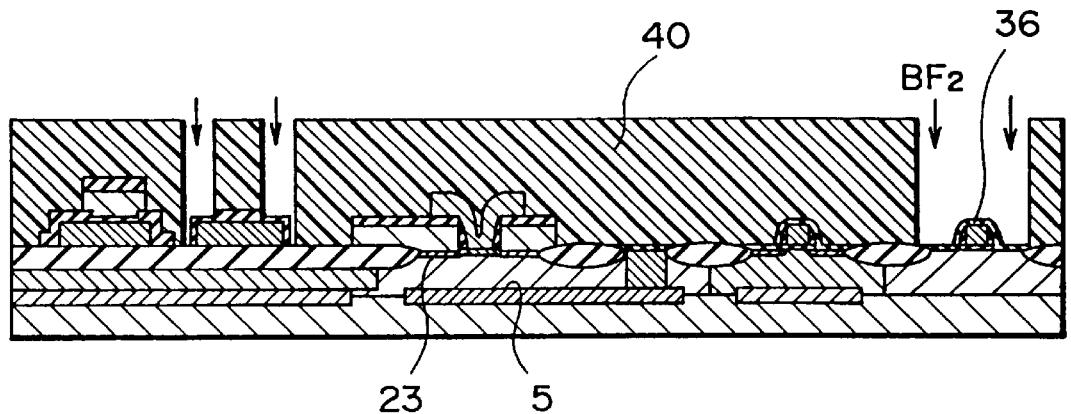

Then, heat treatment at the temperature of 800 to 850° C. is given in nitrogen atmosphere. By the step, as shown in FIG. 2G, boron is diffused from the polycrystalline silicon layer 37 in the base electrode forming region into the N-type single crystalline silicon layer 5 to form a graft base 23 of the bipolar transistor. There is formed a resist 40 having selectively openings on the P-channel MOS transistor portion and on a contact forming region in which a contact region of the resistive element is to be formed. Thereafter, taking the resist 40 as a mask, $BF_2$ is ion-implanted into a region in which a source-drain diffusion layer of the P-channel MOS transistor is to be formed, a region in which a gate electrode of the P-channel MOS transistor is to be formed, and the contact forming region of the resistive element. The implantation energy at this time is set to be in the range of 40 to 90 keV according to the thickness of the oxide film 36, so that the boron is passed through the oxide film 36 and implanted in the predetermined depth of each region.

Figure 2H:
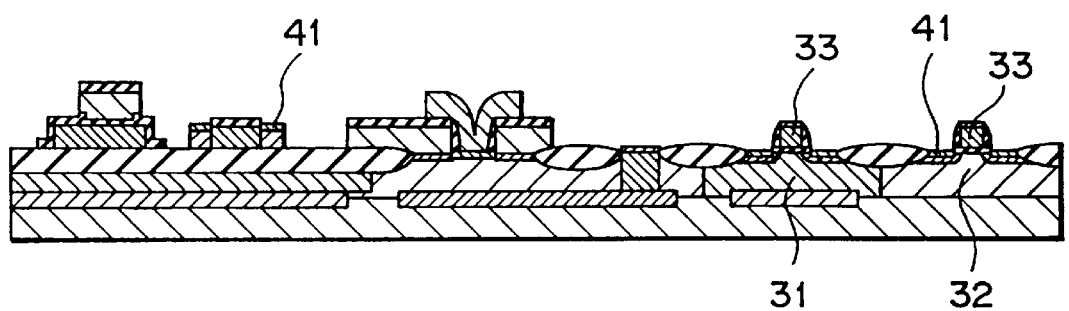
Figure 2I:
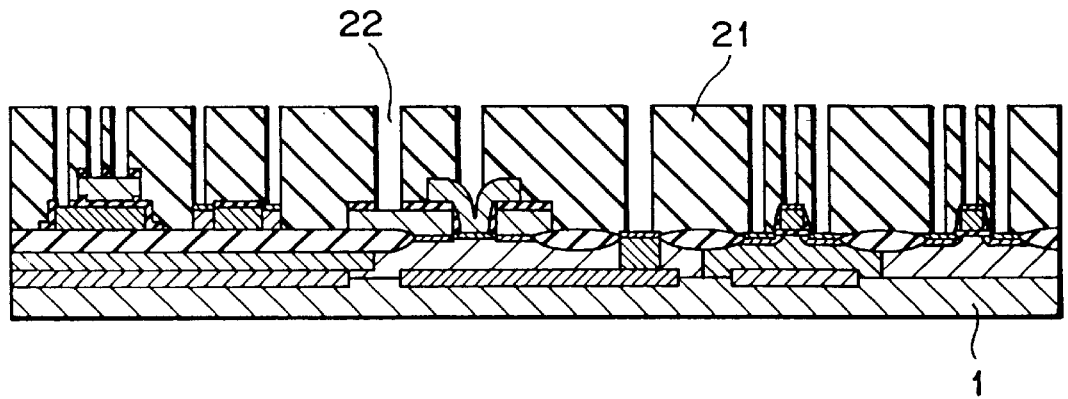

Then, as shown in FIG. 2H, the lump annealing technique is employed to effect annealing at 1000° C. for 10 to 30 seconds in order to activate the impurities in the gate electrode forming region and the source-drain forming region of the P-channel MOS transistor. By this step, prevention can be made of the thrusting through of boron which is a problem in the P-channel MOS transistor, namely, of the passing through the gate oxide film and diffusing into the channel region, and additionally a high performance bipolar transistor is formed. Thereafter, the oxide film covering the both MOS transistor portions is removed by dry etching technique, and the surfaces of the polycrystalline silicon layer 33 and the diffusion layer are exposed. Then a refractory metal layer composed of, for example, Ti is stacked. The refractory metal layer is not limited to the Ti layer but may be a W layer or the like.

Next, the refractory metal layer is provided with heat treatment and silicified to be a titanium silicide layer 41. At such time, only the region not covered with the oxide film is silicified and it becomes possible to reduce the contact resistance in the resistive element portion. The upper surface of the polycrystalline silicon layer 33 and the surfaces of the P-type well 31 and N-type well 32 are silicified, and the lateral sides of the polycrystalline silicon layer 33 covered with the side wall oxide films 34 and 36 are not silicified in the both MOS transistor portions. Thereafter, the Ti layer that is not silicified is removed by etching.

Next, as shown in FIG. 21, an inter-layer insulation film 21 is formed on the whole surface, after which contact holes 22 are selectively formed. The subsequent aluminum wiring forming process and the like are to be carried out according to the known method to complete the semiconductor device by the conventional method.

In the present embodiment, simultaneously with the formation of the first side wall oxide film 34, the oxide film which determines the resistive amount of the resistive element can be formed. Additionally, simultaneously with the formation of the second side wall oxide film 36, the capacitive element insulation film of the capacitive element can be formed. Accordingly, it is possible to reduce the whole process steps. Moreover, as only the regions which are expected to be silicified are exposed in silicifying the gate electrodes and the source-drain diffusion layers and the like, there is not required any mask or protective film which is to be used exclusively for the process. Accordingly, it becomes possible to reduce the process steps and lower the cost.

In the embodiment, after forming a graft base 23 in the bipolar transistor portion, $BF_2$ is implanted into the p-channel MOS transistor portion and heat treatment is provided. Accordingly, the oozing of boron to the channel region is prevented. For this reason, even if the p-channel MOS transistor is a surface channel type one, the leak current and the short channel effect are extremely small.

Next, the second embodiment of the present invention is explained. In this embodiment, in order to produce a capacitive element in higher precision, a nitride film is used as the capacitive insulation film. FIGS. 3A to 3I are sectional views showing a manufacturing method of the semiconductor device according to the second embodiment of the present invention in order of process steps. In this embodiment, first, a P-type silicon substrate 51 is divided into a bipolar transistor portion, in which a bipolar transistor is to be formed, a P-channel MOS transistor portion, in which a P-channel MOS transistor is to be formed, an N-channel MOS transistor portion, in which an N-channel MOS transistor is to be formed, a capacitive element portion, in which a capacitive element is to be formed, and a resistive element portion, in which a resistive element is to be formed.

Figure 3A:
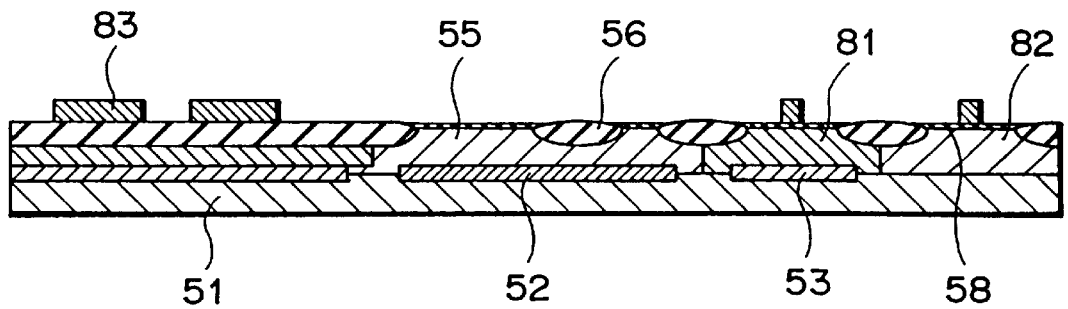
FIGS. 3A to 3I are sectional views showing a manufacturing method of the semiconductor device according to the second embodiment of the present invention in order of process steps.

Next, as shown in FIG. 3A, an $N^+$-type buried layer 52 is formed by ion implantation in the bipolar transistor portion of the P-type silicon substrate 51 with a mask. At this time, an $N^+$-type buried layer 52 may be formed additionally on the P-channel MOS transistor portion. Next, a $P^+$-type buried layer 53 is formed on the N-channel MOS transistor portion and on the peripheral part of the bipolar transistor portion. The bipolar transistor is to be separated by insulation from other elements by this $P^+$-type buried layer 53. Next, while the substrate is heated to a level higher than 1000° C., an N-type single crystalline silicon layer 55 is grown epitaxially on the P-type silicon substrate 51. The $N^+$-type buried layer 52 and the $P^+$-type buried layer 53 are expanded to the N-type single crystalline silicon layer 55 by heating during the step.

Subsequently, by ion implantation, a P-type well 81 is formed on the N-channel MOS transistor portion and on the peripheral part of the bipolar transistor portion, and an N-type well 82 is formed on the P-channel MOS transistor portion. An element separation oxide film 56 is formed by a LOCOS method, which is selective oxidation method, in a thickness of 300 to 400 nm. Next, a gate oxide film 58 and a polycrystalline silicon layer not doped with impurities are grown sequentially on the whole surface of the substrate. A film thickness of the gate oxide film 58 is 5 to 15 nm, and a thickness of the polycrystalline silicon layer is 150 to 200 nm. Next, the polycrystalline silicon layer is selectively removed by dry etching. Therefore, the polycrystalline silicon layer 83 is allowed to remain only in gate electrode forming regions, a lower electrode forming region and a resistor forming region. It should be noted that the gate electrode forming regions are regions in which gate electrodes of the both MOS transistors are to be formed, that the lower electrode forming region is a region in which a lower electrode of the capacitive element is to be formed, and that the resistor forming region is a region in which the resistor of the resistive element is to be formed.

The P-type well 81 and the N-type well 82 may be formed by the high energy ion implantation technique after the selective oxidation.

Figure 3B:
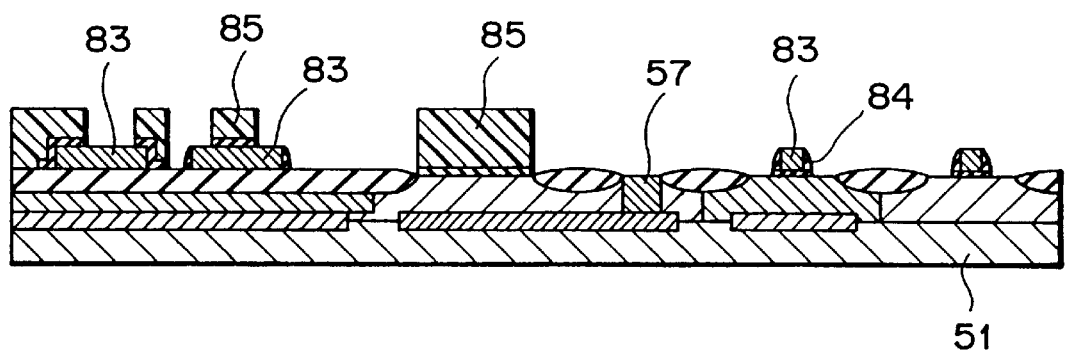

Next, as shown in FIG. 3B, the N-type impurities such as phosphorus are selectively ion-implanted to the N-type single crystalline silicon layer 55 with a mask. By the step, there is formed a collector leading region 57 of an NPN-type transistor which is the bipolar transistor. During the step, there may be practiced simultaneously ion implantation into the lower electrode forming region in order to reduce the number of process steps. Further, impurities such as boron, for example, are ion-implanted into the polycrystalline silicon layer 83 in the resistive element portion in order that the predetermined resistance is obtained. Then, after forming an oxide film having a thickness of 50 to 100 nm on the whole surface, a region in which a base and an emitter of the bipolar transistor are to be formed, the capacitive element portion and the resistive element portion are selectively masked with the resist 85 to etch back the oxide film.

By the process, a side wall oxide film 84 is formed on the lateral side of the polycrystalline silicon layer 83 of the both MOS transistor portions. Also, the oxide film 84a remains in the base and emitter forming region in the bipolar transistor portion. The surface of the polycrystalline silicon layer 83 to be the lower electrode is partially exposed in the capacitive element is portion. In this respect, this process corresponds to the step for opening the capacitive contact as shown in FIG. 1E in the conventional manufacturing method. On the other hand, the side wall oxide film 84 is formed on the lateral side of the polycrystalline silicon layer 83, and the oxide film remains partially on the surface of the polycrystalline silicon layer 83 in the region in the resistive element portion. This is in order to make such that, in the subsequent silicifying process, the whole surface of the resistive element is not silicified to define the resistor length.

Figure 3C:
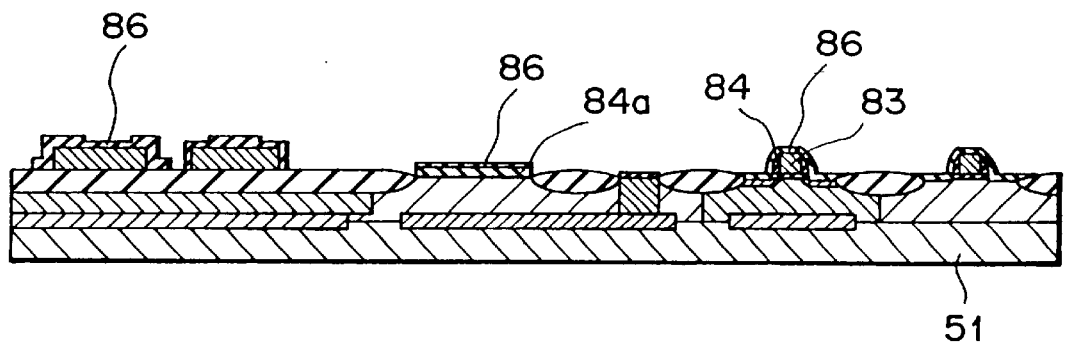

Next, as shown in FIG. 3C, after removing the resist 85, a nitride film 86 having a thickness of 10 to 30 nm is formed on whole surface. Thereby side wall films are formed on the lateral side of the side wall oxide film 84 in the both MOS transistor portions and the resistive element portion. It should be noted that the nitride film 86 formed at this step functions also as a capacitive insulation film of the capacitive element. Thereafter, arsenic is ion-implanted by self-alignment manner into a source-drain forming region, in which a source-drain diffusion layer of the N-channel MOS transistor is to be formed, and a gate electrode forming region, in which a gate electrode of the N-channel MOS transistor is to be formed. The implantation energy at this time is set in the range of 30 to 80 kev according to the film thickness, so that the arsenic is passed through the nitride film 86 and is implanted to the predetermined depth of the P-type well 81. In the range of implantation energy, it does not occur for the arsenic to penetrate through the polycrystalline silicon layer 83, which is to become the gate electrode.

Then, heat treatment is carried out for 5 to 15 minutes in nitrogen atmosphere, at a temperature of 850 to 900° C. By the heat treatment, the impurities in the source-drain forming region of the N-channel MOS transistor are electrically activated, and the activation of the collector leading region, the resistive element portion, and the lower electrode forming region also can be made simultaneously.

The side wall oxide film and the nitride film are stacked in this order on the lateral side of the polycrystalline silicon layer 83 of the resistive element portion in the condition as shown in FIG. 3C. However, they are hereinafter illustrated as the one layer for convenience.

Figure 3D:
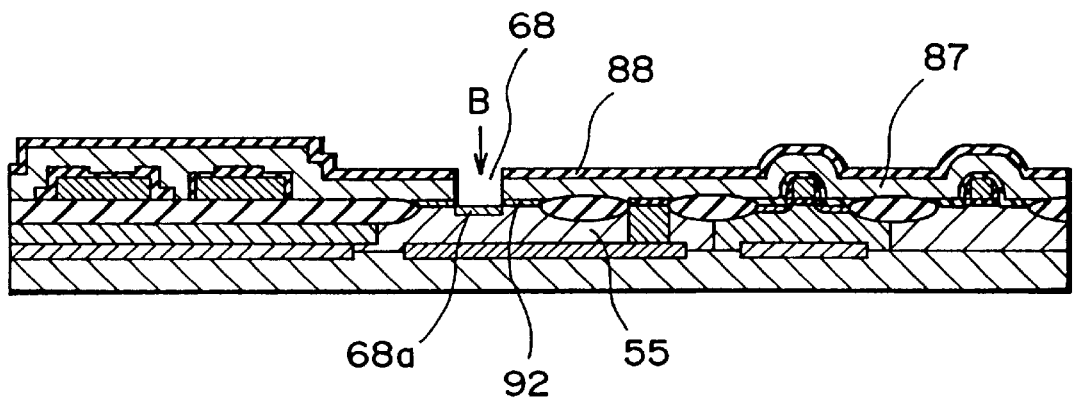

Next, as shown in FIG. 3D, a polycrystalline silicon layer 87 and an oxide film 88 are stacked on the whole surface of the substrate. Then, P-type impurities such as boron are ion-implanted into the polycrystalline silicon layer 87. Thereafter, an emitter contact region 68 is formed by etching the oxide film 88 and the polycrystalline silicon layer 87 on a region in which an emitter contact of the bipolar transistor is to be formed with dry etching technique. Further, the nitride film 86 at the bottom of the emitter contact region 68 is wet-etched with hot phosphoric acid liquid. At this time, the oxide film 88 on the polycrystalline silicon layer 87 functions as a mask for wet-etching the nitride film 86. Also, a region in which an intrinsic base of the bipolar transistor is to be formed is protected from the hot phosphoric acid liquid by the oxide film 84 formed under the nitride film 86, in the emitter contact region 68.

Thereafter, a slit extending in the direction parallel to the substrate surface is formed under the polycrystalline silicon layer 87 by wet-etching the nitride film 86 and the oxide film 84 beneath the polycrystalline silicon layer 87 from the emitter contact region 68. In this case, in order to make the slit length 0.2 to 0.5 $\mu$m, the treating time for the nitride film wet etching and the oxide film wet etching is determined. Then, after forming the polycrystalline silicon layer on the whole surface, isotropic dry etching is carried out to allow the polycrystalline silicon layer 92 to remain only in the slit. By the step, the polycrystalline silicon layer 87, which is to become the base electrode, and the surface of the N-type single crystalline silicon layer 55 are electrically connected. And, an intrinsic base layer 68a is formed by ion-implanting P-type impurities such as boron in the N-type single crystalline silicon layer 55 in the emitter contact region 68.

Figure 3E:
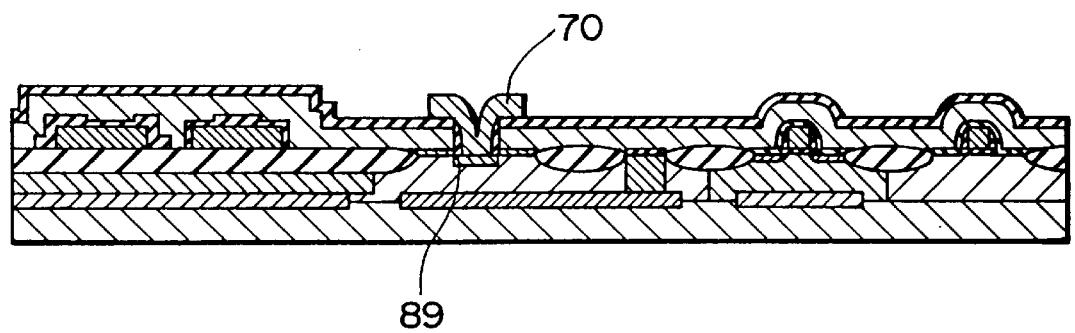

Next, as shown in FIG. 3E, a side wall oxide film 89 is formed in the emitter contact region 68 with etch-back technique, after which a polycrystalline silicon layer is stacked on the whole surface of the substrate. To this polycrystalline silicon layer, the N-type impurities such as arsenic or phosphorus have been added by ion implantation yet, or the N-type are doped at the time of the stacking. Subsequently, by dry etching, the polycrystalline silicon layer is patterned to form an emitter electrode 70 from the polycrystalline silicon layer.

Figure 3F:
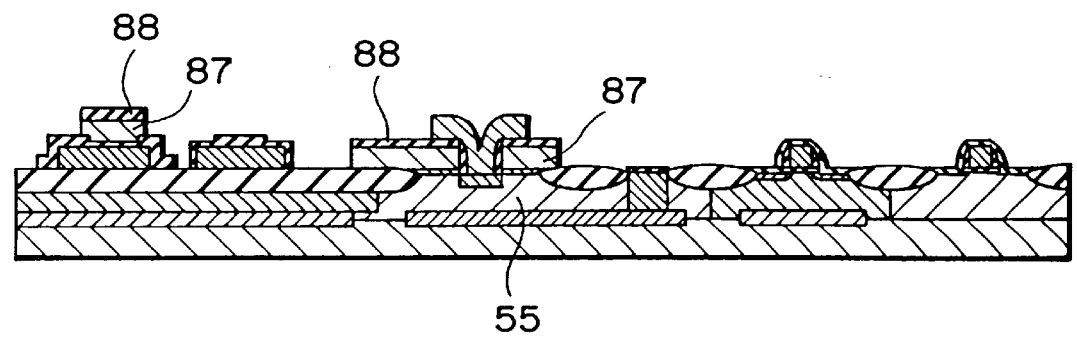

Next, as shown in FIG. 3F, the oxide film 88 and the polycrystalline silicon layer 87 are patterned by dry etching to remain in a region in which a base electrode of the bipolar transistor is to be formed, and a region in which an upper electrode of the capacitive element is to be formed.

Figure 3G:
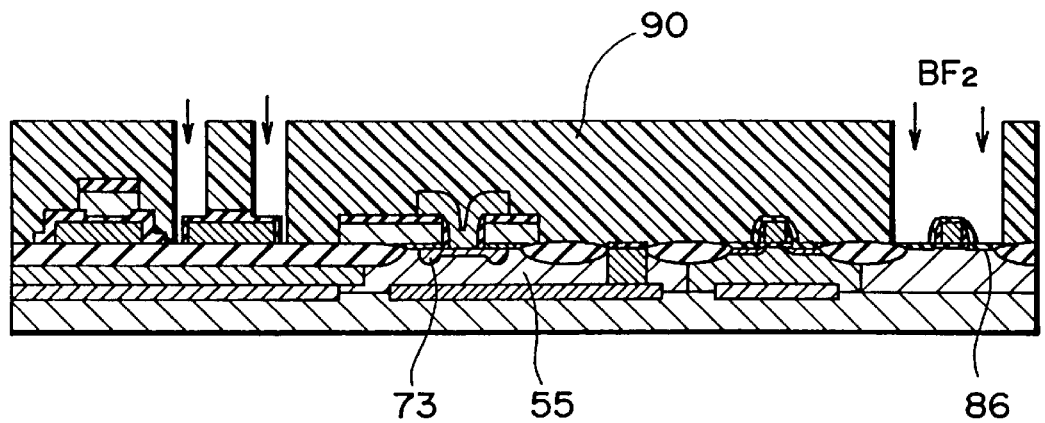

Next, heat treatment at the temperature of 800 to 850° C. is given in nitrogen atmosphere. By the step, as shown in FIG. 3G, boron is diffused from the polycrystalline silicon layer 87 in the base electrode forming region into the N-type single crystalline silicon layer 55 to form a graft base 73 of the bipolar transistor. At this time, the polycrystalline silicon layer 87, which becomes the base electrode, and the graft base 73 are electrically connected. There is formed a resist 90 having selectively openings on the P-channel MOS transistor portion and on a contact forming region in which a contact region of the resistive element is to be formed. Thereafter, taking the resist 90 as a mask, $BF_2$ is ion-implanted into a region in which a source-drain of the P-channel MOS transistor is to be formed, a region in which a gate electrode of the P-channel MOS transistor is to be formed, and the contact forming region. The implantation energy at this time is set to be in the range of 40 to 90 keV according to the thickness of the nitride film 86, so that the boron is passed through the nitride film 86 and implanted in the predetermined depth of each region.

Figure 3H:
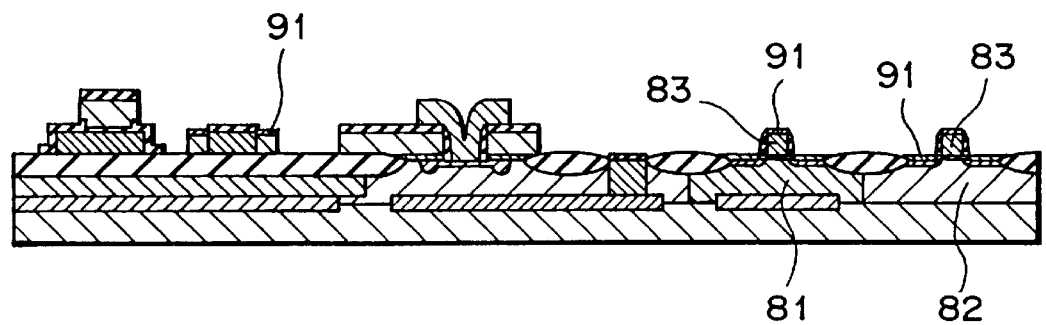

Next, as shown in FIG. 3H, the lump annealing technique is employed to effect annealing at 1000° C. for 10 to 30 seconds in order to activate the impurities in the gate electrode forming region and the source-drain forming region of the P-channel MOS transistor. Thereafter, the nitride film 86 covering the both MOS transistor portions are removed by dry etching technique, and the surfaces of the polycrystalline silicon layer 83 and the diffusion layer are exposed. Then a refractory metal layer composed of, for example, Ti is stacked. The refractory metal layer is not limited to the Ti layer but may be a W layer or the like.

Next, the refractory metal layer is provided with heat treatment and silicified to be a titanium silicide layer 91. At such time, only the region not covered with the oxide film is silicified and it becomes possible to reduce the contact resistance in the resistive element portion. The upper surface of the polycrystalline silicon layer 83 and the surfaces of the P-type well 81 and N-type well 82 are silicified, and the lateral sides of the polycrystalline silicon layer 83 covered with the side wall are not silicified in the both MOS transistor portions. Thereafter, the Ti layer which is not silicified is removed by etching.

Figure 3I:
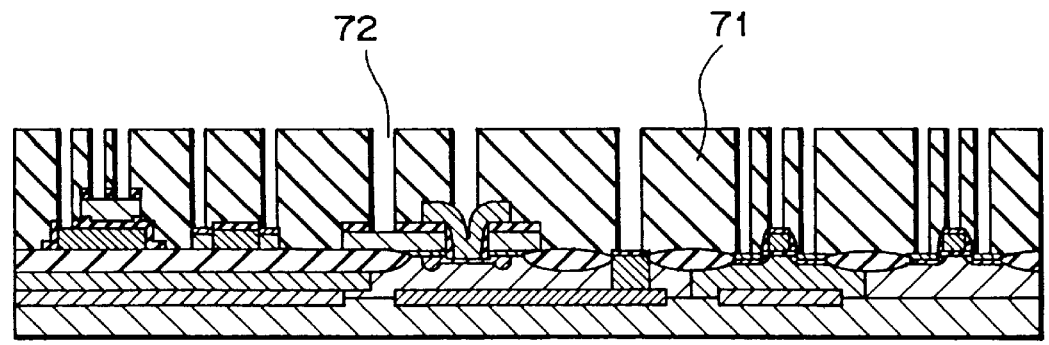

Next, as shown in FIG. 3I, an inter-layer insulation film 71 is formed on the whole surface, after which contact holes 72 are selectively formed. The subsequent aluminum wiring forming process and the like are to be carried out according to the known method to complete the semiconductor device by the conventional method.

In the present embodiment, it is possible to reduce the number of process steps for forming the insulation films. Moreover, as only the regions which are expected to be silicified are exposed in silicifying the gate electrodes and the source-drain diffusion layers and the like, there is not required any mask or protective film which is to be used exclusively for the process. Accordingly, it becomes possible to reduce the process steps and lower the cost.

In this embodiment, after forming a graft base 73 in the bipolar transistor portion, $BF_2$ is implanted into the p-channel MOS transistor portion and heat treatment is provided. Accordingly, the oozing of boron to the channel region is prevented. For this reason, even if the p-channel MOS transistor is a surface channel type one, the leak current and short channel effect are extremely small.

What is claimed is:

1. A method of manufacturing a semiconductor device having a MOS transistor and a bipolar transistor in mixture on the same substrate, comprising the steps of:

forming simultaneously;
   a first conductive layer selectively on a region of a semiconductor substrate in which an N-channel MOS transistor is to be formed and on a region in which a P-channel MOS transistor is to be formed;
   a second conductive layer on a region of said semiconductor substrate in which a capacitive element is to be formed; and
   a third conductive layer on a region of said semiconductor substrate in which a resistive element is to be formed;
forming simultaneously;
   a first insulating film on the lateral side of said first conductive layer;
   a second insulating film selectively on said second conductive layer; and
   a third insulating film selectively on said third conductive layer;
forming a fourth insulating film on the whole surface; and
forming simultaneously;
   a fifth conductive layer on a region of said semiconductor substrate in which a bipolar transistor is to be formed; and
   a sixth conductive layer on said fourth
insulating film on said second conductive layer.

2. A method of manufacturing a semiconductor device having a MOS transistor and a bipolar transistor in mixture on the same substrate according to claim 1,
   which further comprising the steps of, between the step of forming said fourth insulating film and the step of forming said fifth conductive layer and said sixth conductive layer:
     implanting N-type impurities into the region in which said N-type channel MOS transistor is to be formed; and
     heating the region into which said N-type impurities are implanted to activate said N-type impurities;
and,
   which further comprising the steps of, after the step of forming said fifth conductive layer and said sixth conductive layer:
     heating said semiconductor substrate to form a graft base of said bipolar transistor beneath said fifth conducive layer;
     implanting P-type impurities into the region in which said p-channel MOS transistor is to be formed and into a surface of said third conductive layer not covered with said third insulating film; and
     heating the region into which said P-type impurities are implanted to activate said P-type impurities.

3. A method of manufacturing a semiconductor device having a MOS transistor and a bipolar transistor in mixture on the same substrate according to claim 2, wherein
   the step of forming said first conductive layer, said second conductive layer and said third conductive layer comprises the steps of:
     forming a first polycrystalline silicon layer on the whole surface;
     patterning said first polycrystalline silicon layer into the shapes of said first conductive layer, said second conductive layer and said third conductive layer;
and,
   the step of forming said fifth conductive layer and sixth conductive layer comprises the steps of:
     forming a second polycrystalline silicon layer having an opening on a region in which an emitter of said bipolar transistor is to be formed on the whole surface;
     forming an emitter electrode consisting of a third polycrystalline silicon layer in said opening; and
     patterning said second polycrystalline silicon layer into the shapes of said fifth conductive layer and sixth conductive layer.

4. A method of manufacturing a semiconductor device having a MOS transistor and a bipolar transistor in mixture on the same substrate according to claim 1, which further comprising the step of implanting N-type impurities into said second conductive layer and a region in which a collector of said bipolar transistor is to be formed, between the step of forming said first conductive layer, said second conductive layer and said third conductive layer and the step of forming said first insulating layer, said second insulating layer and said third insulating layer.

5. A method of manufacturing a semiconductor device having a MOS transistor and a bipolar transistor in mixture on the same substrate according to claim 1, wherein
   a film thickness of said fourth insulating film is thinner than a film thickness of said first insulating film, said second insulating film and said third insulating film.

6. A method of manufacturing a semiconductor device having a MOS transistor and a bipolar transistor in mixture on the same substrate according to claim 1, wherein
   said first insulating film, said second insulating film and said third insulating film are one kind of insulating film selected from the group consisting of an oxide film and a nitride film.

7. A method of manufacturing a semiconductor device having a MOS transistor and a bipolar transistor in mixture on the same substrate according to claim 1, wherein
   said first insulating film is to be a side wall insulating film of said N-channel MOS transistor and said P-channel MOS transistor,
   said second insulating film is to be a capacitive insulating film of said capacitive element, and
   a region in said third conductive layer covered with said third insulating film is to be a substantial resistor of said resistive element.

8. A method of manufacturing a semiconductor device having a MOS transistor and a bipolar transistor in mixture on the same substrate according to claim 1, which further comprising the steps of, after the step of forming said fifth conductive layer and said sixth conductive layer:
   forming a refractory metal layer on said first conductive layer, on said semiconductor substrate in the region in which said N-channel MOS transistor is to be formed, and on said semiconductor substrate in the region in which said P-channel MOS transistor is to be formed; and
   silicifying said refractory metal layer.

9. A method of manufacturing a semiconductor device having a MOS transistor and a bipolar transistor in mixture on the same substrate according to claim 1, wherein
   the step of forming said first insulating film, said second insulating film and said third insulating film comprises the step of forming a fifth insulating film in a region in which a base and an emitter of said bipolar transistor is to be formed, at the same time as the step of forming said first insulating film, said second insulating film and said third insulating film.

10. A method of manufacturing a semiconductor device having a MOS transistor and a bipolar transistor in mixture on the same substrate according to claim 9,
   which further comprising the steps of, between the step of forming said fourth insulating film and the step of forming said fifth conductive layer and said sixth conductive layer:
  implanting N-type impurities into the region in which said N-type channel MOS transistor is to be formed; and
  heating the region into which said N-type impurities are implanted to activate said N-type impurities; and,
which further comprising the steps of, after the step of forming said fifth conductive layer and said sixth conductive layer:
  heating said semiconductor substrate to form a graft base of said bipolar transistor beneath said fifth conducive layer;
  implanting P-type impurities into the region in which said p-channel MOS transistor is to be formed and into a surface of said third conductive layer not covered with said third insulating film; and
  heating the region into which said P-type impurities are implanted to activate said P-type impurities.

11. A method of manufacturing a semiconductor device having a MOS transistor and a bipolar transistor in mixture on the same substrate according to claim 10, wherein
  the step of forming said first conductive layer, said second conductive layer and said third conductive layer comprises the steps of:
    forming a first polycrystalline silicon layer on the whole surface;
    patterning said first polycrystalline silicon layer into the shapes of said first conductive layer, said second conductive layer and said third conductive layer; and,
  the step of forming said fifth conductive layer and sixth conductive layer comprises the steps of:
    forming a second polycrystalline silicon layer having an opening on a region in which an emitter of said bipolar transistor is to be formed on the whole surface;
    removing said fourth insulating film and said fifth insulating film from said opening to form a slit having a length of 0.2 to 0.5 μm between said second polycrystalline silicon layer and said semiconductor substrate;
    forming a third polycrystalline silicon layer in said slit;
    forming an emitter electrode consisting of a fourth polycrystalline silicon layer in said opening; and
    patterning said second polycrystalline silicon layer into the shapes of said fifth conductive layer and said sixth conductive layer.

12. A method of manufacturing a semiconductor device having a MOS transistor and a bipolar transistor in mixture on the same substrate according to claim 9, which further comprising the step of implanting N-type impurities into said second conductive layer and a region in which a collector of said bipolar transistor is to be formed, between the step of forming said first conductive layer, said second conductive layer and said third conductive layer and the step of forming said first insulating layer, said second insulating layer and said third insulating layer.

13. A method of manufacturing a semiconductor device having a MOS transistor and a bipolar transistor in mixture on the same substrate according to claim 9, wherein
  a film thickness of said fourth insulating film is thinner than a film thickness of said first insulating film, said second insulating film and said third insulating film.

14. A method of manufacturing a semiconductor device having a MOS transistor and a bipolar transistor in mixture on the same substrate according to claim 9, wherein
  said first insulating film, said second insulating film and said third insulating film are one kind of insulating film selected from the group consisting of an oxide film and a nitride film.

15. A method of manufacturing a semiconductor device having a MOS transistor and a bipolar transistor in mixture on the same substrate according to claim 9, wherein
  said first insulating film is to be a side wall insulating film of said N-channel MOS transistor and said P-channel MOS transistor,
  said second insulating film is to be a capacitive insulating film of said capacitive element, and
  a region in said third conductive layer covered with said third insulating film is to be a substantial resistor of said resistive element.

16. A method of manufacturing a semiconductor device having a MOS transistor and a bipolar transistor in mixture on the same substrate according to claim 9, which further comprising the steps of, after the step of forming said fifth conductive layer and said sixth conductive layer:
  forming a refractory metal layer on said first conductive layer, on said semiconductor substrate in the region in which said N-channel MOS transistor is to be formed, and on said semiconductor substrate in the region in which said P-channel MOS transistor is to be formed; and
  silicifying said refractory metal layer.

\* \* \* \* \*